(12) United States Patent
Wang et al.

(10) Patent No.: US 10,262,577 B2
(45) Date of Patent: Apr. 16, 2019

(54) SCANNING DRIVER CIRCUIT AND DISPLAY DEVICE WITH THE SAME

(71) Applicant: Shenzhen China Star Optoelectronics Technology Co., Ltd., Shenzhen, Guangdong (CN)

(72) Inventors: Tianhong Wang, Guangdong (CN); Ping-sheng Kuo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 107 days.

(21) Appl. No.: 15/502,569

(22) PCT Filed: Jan. 17, 2017

(86) PCT No.: PCT/CN2017/071340
§ 371 (c)(1),
(2) Date: Feb. 8, 2017

(87) PCT Pub. No.: WO2018/120332
PCT Pub. Date: Jul. 5, 2018

(65) Prior Publication Data
US 2018/0211583 A1 Jul. 26, 2018

(51) Int. Cl.
*G09G 3/20* (2006.01)
*G11C 19/28* (2006.01)

(52) U.S. Cl.
CPC ............ *G09G 3/2092* (2013.01); *G09G 3/20* (2013.01); *G11C 19/28* (2013.01); *G09G 2300/0426* (2013.01); *G09G 2310/0267* (2013.01)

(58) Field of Classification Search
None
See application file for complete search history.

(56) References Cited

U.S. PATENT DOCUMENTS

2009/0184914 A1    6/2009  Han
2016/0140922 A1*   5/2016  Dai ..................... G11C 19/287
                                                          345/92

FOREIGN PATENT DOCUMENTS

| CN | 103745700 A | 4/2014 |
| CN | 104505033 A | 4/2015 |
| CN | 106157916 A | 11/2016 |
| CN | 106205458 A | 12/2016 |
| JP | 09326195 A | 12/1997 |

* cited by examiner

*Primary Examiner* — Kenneth B Lee, Jr.
(74) *Attorney, Agent, or Firm* — Andrew C. Cheng

(57) ABSTRACT

A scanning driver circuit includes N stage-connected GOA units. An Nth-stage GOA unit includes a pull-up part, a pull-up control part, a pull-down holding part, and a key pull-down part. The pull-up part is connected to an output terminal of an Nth stage gate signal. The pull-up control part is connected to the output terminal of the Nth stage gate signal. The pull-down holding part receives a first direct current voltage and a second direct current voltage. The key pull-down part connected to the Nth stage gate signal receives the first direct current voltage. The pull-down holding part is formed by a first pull-down holding circuit and a second pull-down holding circuit. The first pull-down holding circuit and the second pull-down holding circuit operate alternatively so that the output terminal of the Nth stage gate signal and the node can hold at a negative voltage level.

9 Claims, 2 Drawing Sheets

SCANNING DRIVER CIRCUIT AND DISPLAY DEVICE WITH THE SAME

BACKGROUND

1. Field of the Disclosure

The present disclosure relates to the field of a scanning driver circuit for a display device, and more particularly, to a scanning driver circuit with extremely high reliability and a display device with the scanning driver circuit.

2. Description of the Related Art

The gate driver on array (GOA) technique is that a gate driver integrated circuit (i.e. gate driver IC) is formed in an array substrate to scan gate lines row by row.

A conventional GOA circuit mainly includes a plurality of GOA units. The plurality of GOA units are cascaded. Each GOA unit corresponds to a scanning line (i.e. gate line). The structure of the GOA unit includes a pull-up part, a pull-up control part, a transfer part, a key pull-down part, and a pull-down holding part. The pull-up part is mainly used to output a clock signal to be a gate signal. The pull-up control part is used to control the onset time of the pull-up part and usually connected to a transfer signal or a gate signal sent by a previous stage GOA circuit. The key pull-down part is used to pull the gate signal down to be the gate signal at low voltage level at the first moment. The pull-down holding part is used to hold the gate signal and the gate signal (usually called "Q node") of the pull-up part closed (that is, negative voltage level). Usually, two pull-down holding parts operate alternatively.

The transistors in a regulator circuit of the pull-down holding part bear the greatest pressure in the conventional GOA circuit. After long time operation under the high temperature, high humidity environment, the threshold voltage Vth imposed on each of the transistors shifts seriously. Consequently, the gate signal output to the scanning line becomes abnormal, which further causes the images to become abnormal.

SUMMARY

According to the present disclosure, a scanning driver circuit includes N stage-connected gate driver on array (GOA) units. An Nth-stage GOA unit includes a pull-up part, a pull-up control part, a pull-down holding part, and a key pull-down part. A clock signal is output by the pull-up part to be a gate signal. The onset time of the pull-up part is controlled by the pull-up control part. The pull-up part is connected to a node and an output terminal of an Nth stage gate signal. The pull-up control part is connected to the output terminal of the Nth stage gate signal. The pull-down holding part is configured to receive a first direct current voltage and a second direct current voltage. The key pull-down part is connected to the output terminal of the Nth stage gate signal and configured to receive the first direct current voltage. The pull-down holding part is formed by a first pull-down holding circuit and a second pull-down holding circuit. Both of the first pull-down holding circuit and the second pull-down holding circuit are mirror-connected. The first pull-down holding circuit and the second pull-down holding circuit operate alternatively so that the output terminal of the Nth stage gate signal and the node can hold at a negative voltage level.

Furthermore, the first pull-down holding circuit includes a first regulator circuit part, a first transistor, a 52nd transistor, and a third transistor. The first transistor and the 52nd transistor are connected to a drain and the first regulator circuit part. A source of the 52nd transistor is connected to a drain and a gate of the third transistor. A source of the third transistor is configured to receive the first direct current voltage. A source of the first transistor is configured to receive the second direct current voltage. A gate of the first transistor is configured to receive a control voltage. A drain of the first transistor and a drain of the 52nd transistor are connected and configured to receive a first low frequency clock signal. The second pull-down holding circuit includes a second regulator circuit part, a second transistor, a 62nd transistor, and a fourth transistor. The second transistor and the 62nd transistor are connected to the drain and the second regulator circuit part. A source of the 62nd transistor is connected to a drain and a gate of the fourth transistor. A source of the fourth transistor is configured to receive the first direct current voltage. A source of the second transistor is configured to receive the second direct current voltage. A gate of the second transistor is configured to receive the control voltage. A drain of the second transistor and a drain of the 62nd transistor are connected and configured to receive a second low frequency clock signal. Both of the first regulator circuit part and the second regulator circuit part are connected to the output terminal of the Nth stage gate signal. The first direct current voltage is greater than the second direct current voltage.

Furthermore, the first regulator circuit part comprises a 33rd transistor and a 43rd transistor. A gate of the 33rd transistor is connected to a gate of the 43rd transistor. The gate of the 33rd transistor and the gate of the 43rd transistor are connected to the drain of the first transistor. A source of the 33rd transistor and a source of the 43rd transistor are configured to receive the first direct current voltage. A drain of the 33rd transistor is connected to the output terminal of the Nth stage gate signal. A drain of the 43rd transistor is connected to the node.

Furthermore, the second regulator circuit part includes a 32nd transistor and a 42nd transistor. A gate of the 32nd transistor is connected to a gate of the 42nd transistor. The gate of the 32nd transistor and the gate of the 42nd transistor are connected to the drain of the first transistor; a source of the 32nd transistor and a source of the 42nd transistor are configured to receive the first direct current voltage. A drain of the 32nd transistor is connected to the output terminal of the Nth stage gate signal. A drain of the 42nd transistor is connected to the node.

Furthermore, the pull-up control part includes a 21st transistor. A gate of the 21st transistor is connected to a transfer signal of an (N–2)th stage GOA unit. A drain and a source of the 21st transistor are connected to an output terminal of an (N–4)th stage gate signal and the node, respectively.

Furthermore, the gate of the 21st transistor is configured to connect an onset signal terminal. A drain of the 21st transistor and a source of the 21st transistor are connected to the onset signal terminal and the node, respectively, in a first stage GOA unit. Both of the gate of the 21st transistor and the drain of the 21st transistor are connected to the onset signal terminal, and a source of the 21st transistor is connected to the node in a second stage GOA unit.

Furthermore, the key pull-down part includes a 41st transistor. A gate of the 41st transistor is connected to an output terminal of an (N+2)th stage gate signal. A drain and a source of the 41st transistor are connected to the output terminal G(N) of the Nth stage gate signal and the second direct current voltage, respectively.

Furthermore, the second direct current voltage is supplied with −10V, and the control voltage is supplied with −15V.

Furthermore, the first low frequency clock signal is inverted to the second low frequency clock signal.

The present disclosure also proposes a display having the scanning driver circuit as provided above.

The present disclosure brings the effect as follows: The reliability of the scanning driver circuit is extremely high so the display device with the scanning driver circuit shows normal images constantly without any abnormality.

BRIEF DESCRIPTION OF THE DRAWINGS

The drawings illustrate embodiments of the invention and, together with the description, serve to explain the principles of the invention.

DETAILED DESCRIPTION OF THE PREFERRED EMBODIMENTS

Figure 1:
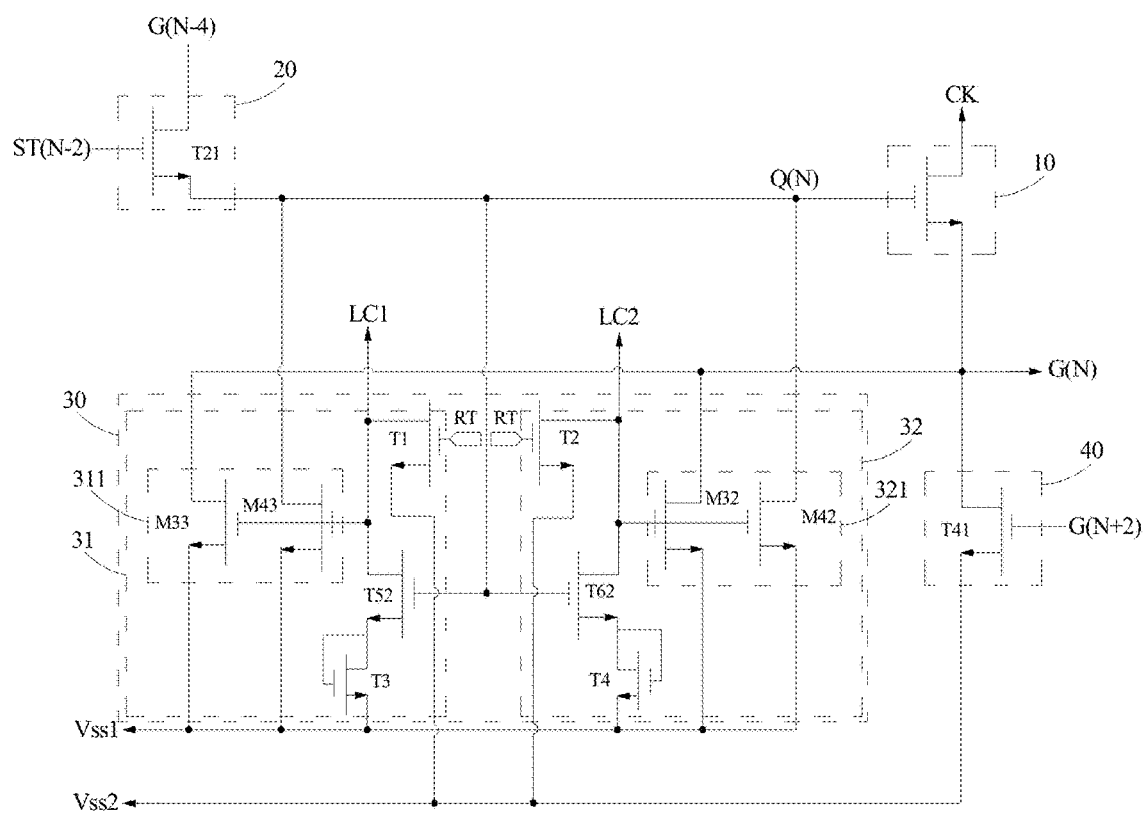
FIG. 1 illustrates a circuit diagram of an Nth stage gate driver on array (GOA) unit according to one preferred embodiment of the present disclosure.

The invention is described below in detail with reference to the accompanying drawings, wherein like reference numerals are used to identify like elements illustrated in one or more of the figures thereof, and in which exemplary embodiments of the invention are shown. This invention may, however, be embodied in many different forms and should not be construed as limited to the particular embodiments set forth herein. Rather, these embodiments are provided so that this disclosure will be thorough and complete, and will fully convey the scope of the invention to those skilled in the art.

Please refer to FIG. 1 illustrating a circuit diagram of an Nth stage gate driver on array (GOA) unit according to one preferred embodiment of the present disclosure. The GOA unit includes N stage-connected GOA units as shown in FIG. 1.

Please refer to FIG. 1. The Nth-stage GOA unit includes a pull-up part 10, a pull-up control part 20, a pull-down holding part 30, and a key pull-down part 40. A clock signal CK is output by the pull-up part 10 to be a gate signal. The onset time of the pull-up part 10 is controlled by the pull-up control part 20.

The pull-up part 10 is connected to a node Q(N) and an output terminal G(N) of an Nth stage gate signal. The pull-up control part 20 is connected to the output terminal G(N) of the Nth stage gate signal. The pull-down holding part 30 is used to receive a first direct current voltage VSS1 and a second direct current voltage VSS2. The key pull-down part 40 is connected to the output terminal G(N) of the Nth stage gate signal and used to receive the first direct current voltage VSS1.

The pull-down holding part 30 is formed by a first pull-down holding circuit 31 and a second pull-down holding circuit 32. Both of the first pull-down holding circuit 31 and the second pull-down holding circuit 32 are mirror-connected. The first pull-down holding circuit 31 and the second pull-down holding circuit 32 operate alternatively so that the output terminal G(N) of the Nth stage gate signal and the node Q(N) can hold at a negative voltage level.

The first pull-down holding circuit 31 includes a first regulator circuit part 311, a first transistor T1, a 52nd transistor T52, and a third transistor T3. The first transistor T1 and the 52nd transistor T52 are connected to a drain and the first regulator circuit part 311. A source of the 52nd transistor T52 is connected to a drain and a gate of the third transistor T3. A source of the third transistor T3 is used to receive the first direct current voltage VSS1. A source of the first transistor T1 is used to receive the second direct current voltage VSS2. A gate of the first transistor T1 is used to receive a control voltage RT. A drain of the first transistor T1 and a drain of the 52nd transistor T52 are connected and used to receive a first low frequency clock signal LC1.

The second pull-down holding circuit 32 includes a second regulator circuit part 321, a second transistor T2, a 62nd transistor T62, and a fourth transistor T4. The second transistor T2 and the 62nd transistor T62 are connected to the drain and the second regulator circuit part 321. A source of the 62nd transistor T62 is connected to a drain and a gate of the fourth transistor T4. A source of the fourth transistor T4 is used to receive the first direct current voltage VSS1. A source of the second transistor T2 is used to receive the second direct current voltage VSS2. A gate of the second transistor T2 is used to receive the control voltage RT. A drain of the second transistor T2 and a drain of the 62nd transistor T62 are connected and used to receive a second low frequency clock signal LC2.

Both of the first regulator circuit part 311 and the second regulator circuit part 321 are connected to the output terminal G(N) of the Nth stage gate signal. The first direct current voltage VSS1 is greater than the second direct current voltage VSS2.

The first regulator circuit part 311 includes a 33rd transistor M33 and a 43rd transistor M43. A gate of the 33rd transistor M33 is connected to a gate of the 43rd transistor M43. The gate of the 33rd transistor M33 and the gate of the 43rd transistor M43 are connected to the drain of the first transistor T1. A source of the 33rd transistor M33 and a source of the 43rd transistor M43 are used to receive the first direct current voltage VSS1. A drain of the 33rd transistor M33 is connected to the output terminal G(N) of the Nth stage gate signal. A drain of the 43rd transistor M43 is connected to the node Q(N).

The second regulator circuit part 321 includes a 32nd transistor M32 and a 42nd transistor M42. A gate of the 32nd transistor M32 is connected to a gate of the 42nd transistor M42. The gate of the 32nd transistor M32 and the gate of the 42nd transistor M42 are connected to the drain of the first transistor T1. A source of the 32nd transistor M32 and a source of the 42nd transistor M42 are used to receive the first direct current voltage VSS1. A drain of the 32nd transistor M32 is connected to the output terminal G(N) of the Nth stage gate signal. A drain of the 42nd transistor M42 is connected to the node Q(N).

The pull-up control part 20 includes a 21st transistor T21. The 21st transistor T21 includes a gate, which is connected to a transfer signal ST(N−2) of an (N−2)th stage GOA unit. The 21st transistor T21 includes a drain and a source, which are connected to an output terminal G(N−4) of an (N−4)th stage gate signal and the node Q(N), respectively.

The gate of the 21st transistor T21 is used to connect an onset signal terminal STV, and a drain of the 21st transistor T21 and a source of the 21st transistor T21 are connected to the onset signal terminal STV and the node Q(N), respectively, in a first stage GOA unit. Both of the gate of the 21st transistor T21 and the drain of the 21st transistor T21 are connected to the onset signal terminal STV, and a source of the 21st transistor T21 is connected to the node Q(N) in a second stage GOA unit.

The key pull-down part 40 includes a 41st transistor T41. The 41st transistor T41 includes a gate, which is connected to an output terminal G(N+2) of an (N+2)th stage gate signal. The 41st transistor T41 includes a drain and a source, which are connected to the output terminal G(N) of the Nth stage gate signal and the second direct current voltage VSS2, respectively.

The second direct current voltage VSS2 is set to be −10V and the control voltage RT is set to be −15V in this embodiment. In addition, the phase of the first low frequency clock signal LC1 is reverse to the phase of the second low frequency clock signal LC2.

All of the transistors used in the embodiments are thin-film transistors (TFTs), which are not confined in the present disclosure.

Figure 2:
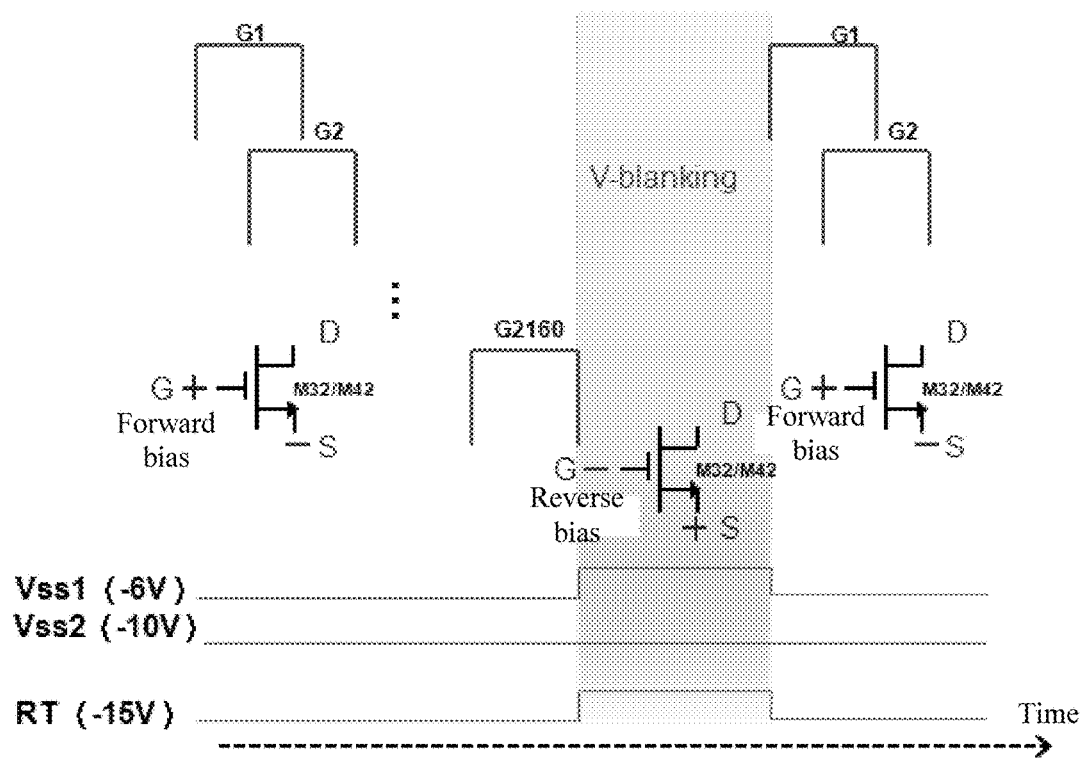
FIG. 2 illustrates an operating timing diagram of a scanning driver circuit according to the preferred embodiment of the present disclosure.

Please refer to FIG. 2 illustrating an operating sequence diagram of a scanning driver circuit according to the preferred embodiment of the present disclosure. In this figure, 2016 scanning signals are shown. They are G1, G2, ..., and G2160. However, the number of the scanning signals is confined in the present disclosure.

Please refer to FIG. 2. In the V-blanking time for one frame where all of the clock signals terminate to the following frame for the rising edge of the onset signal STV, the voltage level of the first direct current voltage VSS1 turns from low into high. The voltage level of the control voltage RT turns from low into high. The first direct current voltage VSS1 is greater than the second direct current voltage VSS2.

At this time, both of the voltages across the gate and source of the 32nd transistor and across the gate and the source of the 42nd transistor are reverse bias in the V-blanking time which indicates a time period from an end of one frame to a rising edge of the start signal STV of the following frame. Both of the voltages across the gate and source of the 32nd transistor and across the gate and the source of the 42nd transistor keeps forward bias in the remaining time.

Above are embodiments of the present invention, which does not limit the scope of the present invention. Any modifications, equivalent replacements or improvements within the spirit and principles of the embodiment described above should be covered by the protected scope of the invention.

What is claimed is:

1. A scanning driver circuit, comprising: N stage-connected gate driver on array (GOA) units, wherein an Nth-stage GOA unit comprises a pull-up part, a pull-up control part, a pull-down holding part, and a key pull-down part; a clock signal is output by the pull-up part to be a gate signal; the onset time of the pull-up part is controlled by the pull-up control part;

the pull-up part is connected to a node and an output terminal of an Nth stage gate signal; the pull-up control part is connected to the output terminal of the Nth stage gate signal; the pull-down holding part is configured to receive a first direct current voltage and a second direct current voltage; the key pull-down part is connected to the output terminal of the Nth stage gate signal and configured to receive the first direct current voltage;

the pull-down holding part is formed by a first pull-down holding circuit and a second pull-down holding circuit; both of the first pull-down holding circuit and the second pull-down holding circuit are mirror-connected; the first pull-down holding circuit and the second pull-down holding circuit operating alternatively so that the output terminal of the Nth stage gate signal and the node can hold at a negative voltage level, wherein the first pull-down holding circuit comprises a first regulator circuit part, a first transistor, a 52nd transistor, and a third transistor; drains of the first transistor and the 52nd transistor are connected to the first regulator circuit part; a source of the 52nd transistor is connected to a drain and a gate of the third transistor; a source of the third transistor is configured to receive the first direct current voltage; a source of the first transistor is configured to receive the second direct current voltage; a gate of the first transistor is configured to receive a control voltage; a drain of the first transistor and a drain of the 52nd transistor are connected and configured to receive a first low frequency clock signal;

the second pull-down holding circuit comprises a second regulator circuit part, a second transistor, a 62nd transistor, and a fourth transistor; drains of the second transistor and the 62nd transistor are connected to the second regulator circuit part; a source of the 62nd transistor is connected to a drain and a gate of the fourth transistor; a source of the fourth transistor is configured to receive the first direct current voltage; a source of the second transistor is configured to receive the second direct current voltage; a gate of the second transistor is configured to receive the control voltage; a drain of the second transistor and a drain of the 62nd transistor are connected and configured to receive a second low frequency clock signal;

both of the first regulator circuit part and the second regulator circuit part are connected to the output terminal of the Nth stage gate signal; the first direct current voltage is greater than the second direct current voltage.

2. The scanning driver circuit of claim 1, wherein the first regulator circuit part comprises a 33rd transistor and a 43rd transistor; a gate of the 33rd transistor is connected to a gate of the 43rd transistor; the gate of the 33rd transistor and the gate of the 43rd transistor are connected to the drain of the first transistor; a source of the 33rd transistor and a source of the 43rd transistor are configured to receive the first direct current voltage; a drain of the 33rd transistor is connected to the output terminal of the Nth stage gate signal; a drain of the 43rd transistor is connected to the node.

3. The scanning driver circuit of claim 1, wherein the second regulator circuit part comprises a 32nd transistor and a 42nd transistor; a gate of the 32nd transistor is connected to a gate of the 42nd transistor; the gate of the 32nd transistor and the gate of the 42nd transistor are connected to the drain of the first transistor; a source of the 32nd transistor and a source of the 42nd transistor are configured to receive the first direct current voltage; a drain of the 32nd transistor is connected to the output terminal of the Nth stage gate signal; a drain of the 42nd transistor is connected to the node.

4. The scanning driver circuit of claim 1, wherein the pull-up control part comprises a 21st transistor; a gate of the 21st transistor is connected to a transfer signal of an (N−2)th stage GOA unit; a drain and a source of the 21st transistor are connected to an output terminal of an (N−4)th stage gate signal and the node, respectively.

5. The scanning driver circuit of claim 4, wherein the gate of the 21st transistor is configured to connect an onset signal terminal; a drain of the 21st transistor and a source of the 21st transistor are connected to the onset signal terminal and the node, respectively, in a first stage GOA unit;

both of the gate of the 21st transistor and the drain of the 21st transistor are connected to the onset signal terminal, and a source of the 21st transistor is connected to the node in a second stage GOA unit.

6. The scanning driver circuit of claim 1, wherein the key pull-down part comprises a 41st transistor; a gate of the 41st transistor is connected to an output terminal of an (N+2)th stage gate signal; a drain and a source of the 41st transistor are connected to the output terminal G(N) of the Nth stage gate signal and the second direct current voltage, respectively.

7. The scanning driver circuit of claim 1, wherein the second direct current voltage is supplied with −10V, and the control voltage is supplied with −15V.

8. The scanning driver circuit of claim 1, wherein the first low frequency clock signal is inverted to the second low frequency clock signal.

9. A display comprising the scanning driver circuit as claimed in claim 1.

* * * * *